(12) United States Patent
Kamigaichi et al.

(10) Patent No.: US 8,253,188 B2
(45) Date of Patent: Aug. 28, 2012

(54) SEMICONDUCTOR STORAGE DEVICE AND METHOD FOR MANUFACTURING THE SAME

(75) Inventors: Takeshi Kamigaichi, Yokohama (JP); Satoshi Nagashima, Yokkaichi (JP); Kenji Aoyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 256 days.

(21) Appl. No.: 12/728,788

(22) Filed: Mar. 22, 2010

(65) Prior Publication Data
US 2010/0237398 A1 Sep. 23, 2010

(30) Foreign Application Priority Data

Mar. 23, 2009 (JP) .................................. 2009-70602

(51) Int. Cl.
*H01L 29/788* (2006.01)
*H01L 29/792* (2006.01)

(52) U.S. Cl. ........ 257/324; 257/326; 257/365; 257/392; 257/500; 257/E29.309; 257/E21.66

(58) Field of Classification Search .................. 257/324, 257/326, 365, 392, 500, E29.309, E21.66
See application file for complete search history.

(56) References Cited

U.S. PATENT DOCUMENTS

| | | | |
|---|---|---|---|
| 4,814,854 A * | 3/1989 | Tigelaar et al. | 257/382 |
| 6,594,169 B2 * | 7/2003 | Sakui | 365/51 |
| 7,061,786 B2 * | 6/2006 | Sakui | 365/63 |
| 8,134,201 B2 * | 3/2012 | Toba | 257/324 |
| 2006/0001073 A1 | 1/2006 | Chen et al. | |
| 2006/0231884 A1 | 10/2006 | Yonemochi et al. | |
| 2007/0096202 A1 | 5/2007 | Kang et al. | |

FOREIGN PATENT DOCUMENTS

JP 2006-302950 11/2006

OTHER PUBLICATIONS

U.S. Appl. No. 13/238,380, filed Sep. 21, 2011, Sakaguchi.
Office Action issued Aug. 16, 2011, in Japanese Patent Application No. 2009-070602 (with English-language translation).

* cited by examiner

*Primary Examiner* — Evan Pert
(74) *Attorney, Agent, or Firm* — Oblon, Spivak, McClelland, Maier & Neustadt, L.L.P.

(57) ABSTRACT

A semiconductor storage device includes a semiconductor substrate, a first insulator, a laminated insulator including a second insulator having fixed charges more than those of the first insulator, a single-layer insulator, memory cells between the semiconductor substrate and the first insulator, each memory cells separated from an adjacent memory cell by a cavity portion and including a tunnel insulator, a charge accumulation layer, an insulator, and a control gate electrode, a first selection gate transistor between the semiconductor substrate and the first insulator, a second selection gate transistor between the semiconductor substrate and the first insulator, between one memory cell and the first selection gate transistor, and in contact with the laminated insulator on a first side face on a memory cell side thereof, and a high-voltage peripheral circuit transistor between the semiconductor substrate and the first insulator, and in contact with the single-layer insulator on a side face thereof.

14 Claims, 14 Drawing Sheets

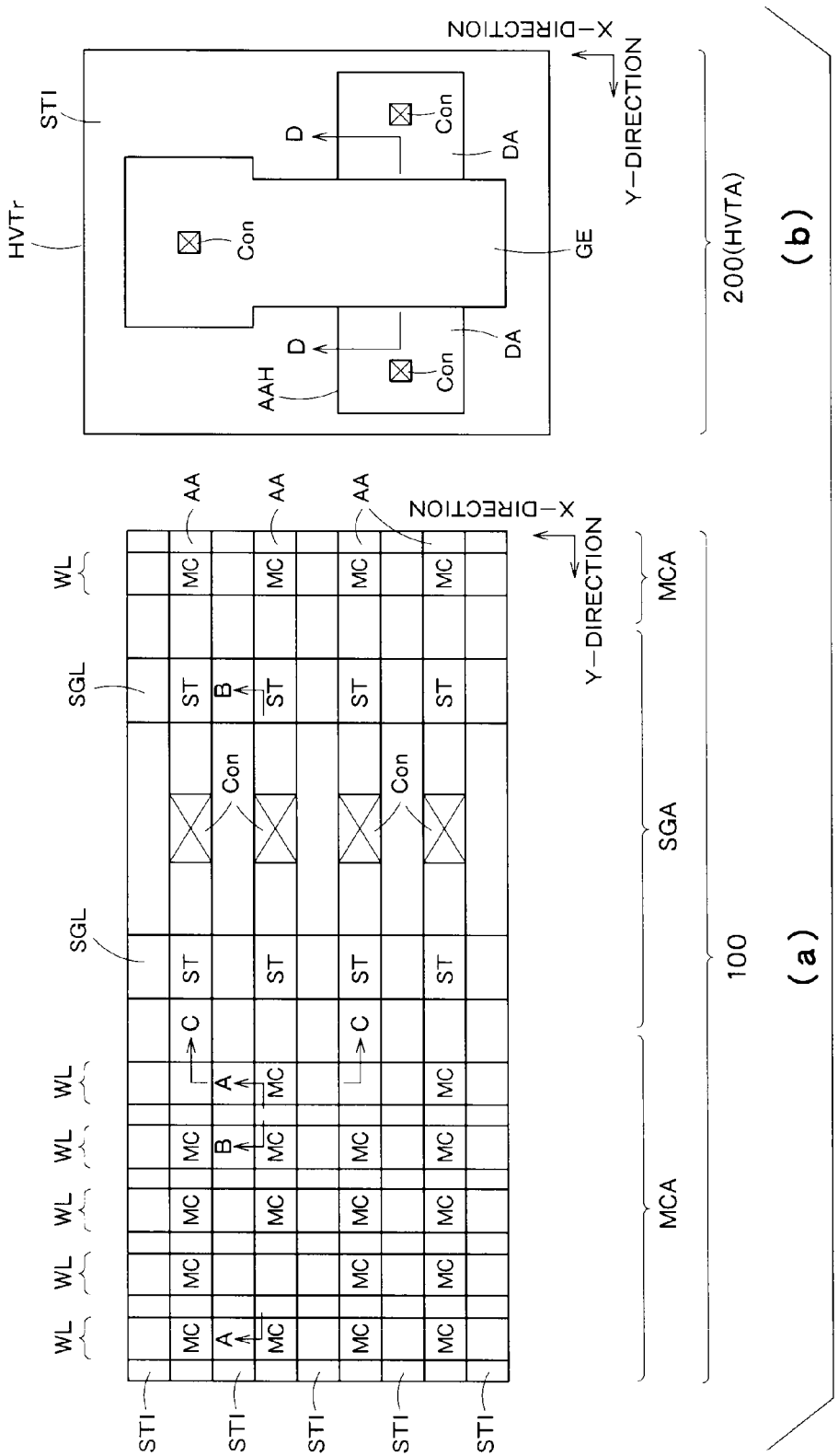
F I G. 1

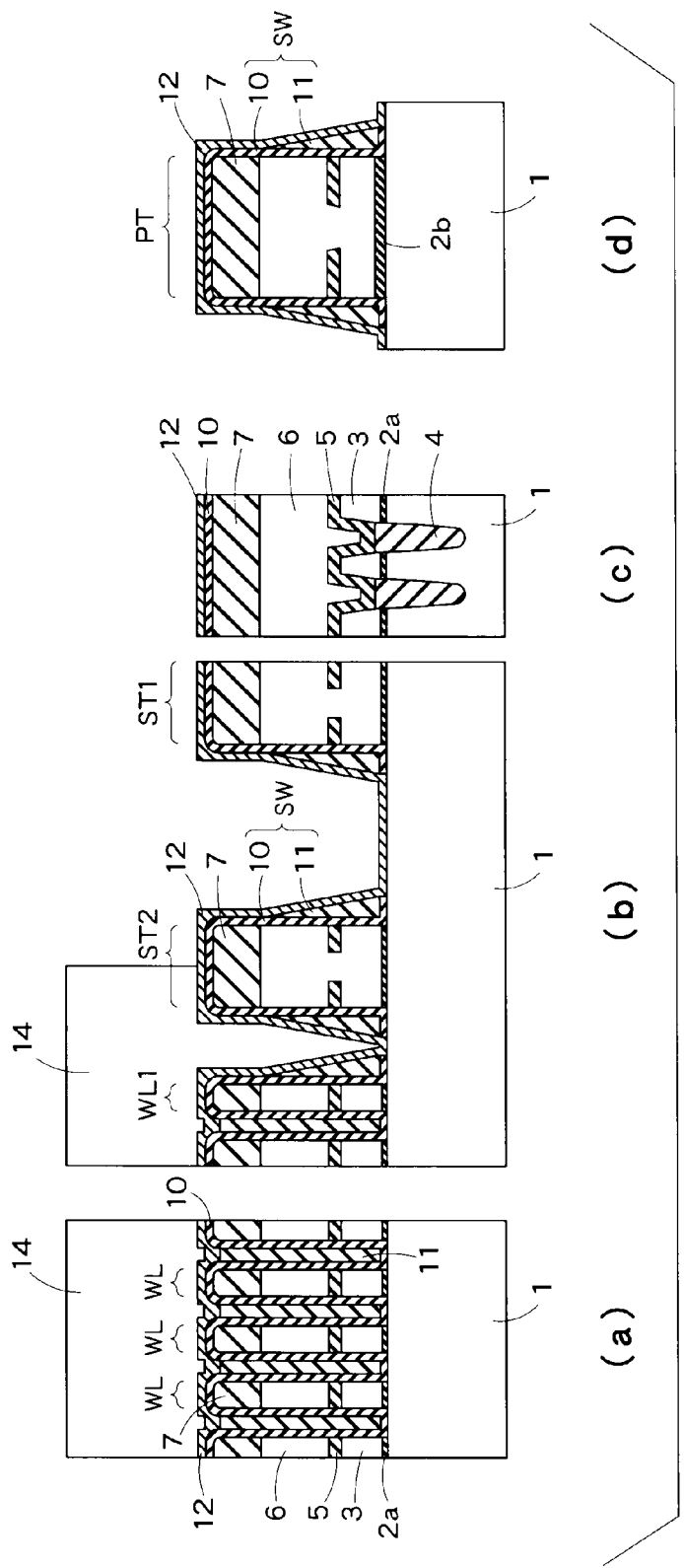
F I G. 5

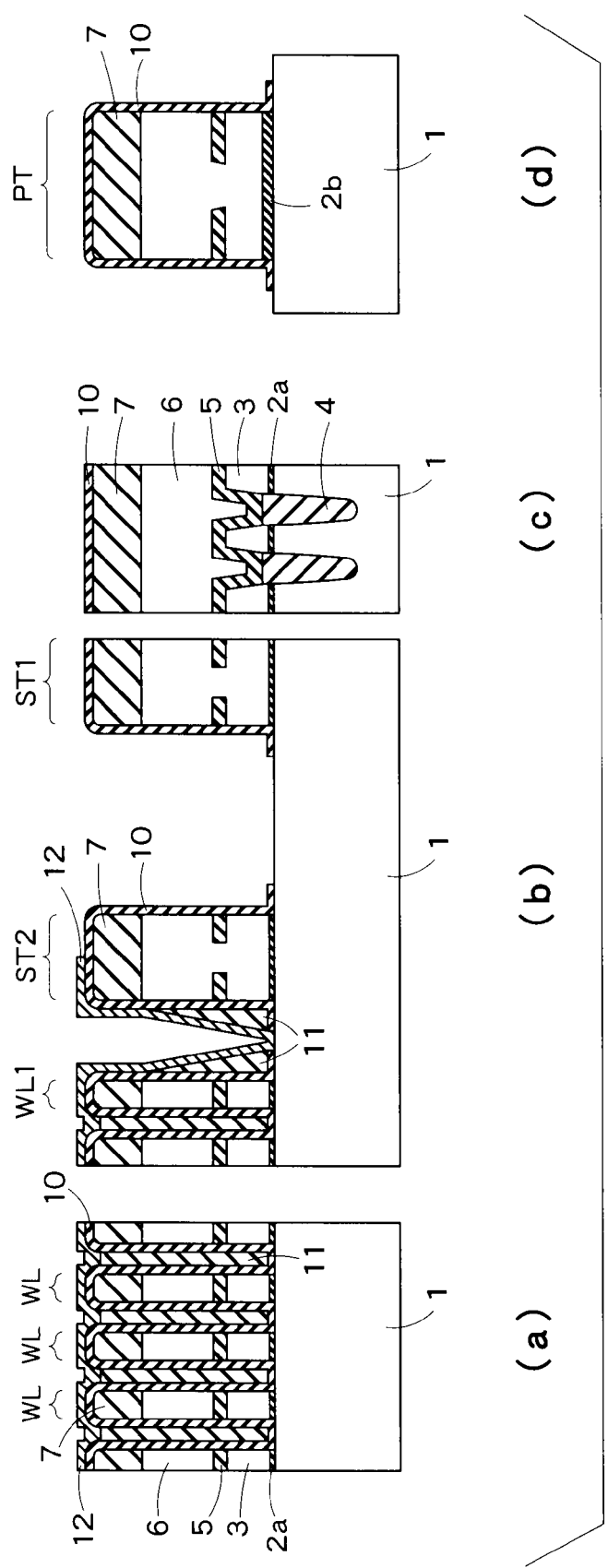
F I G. 7

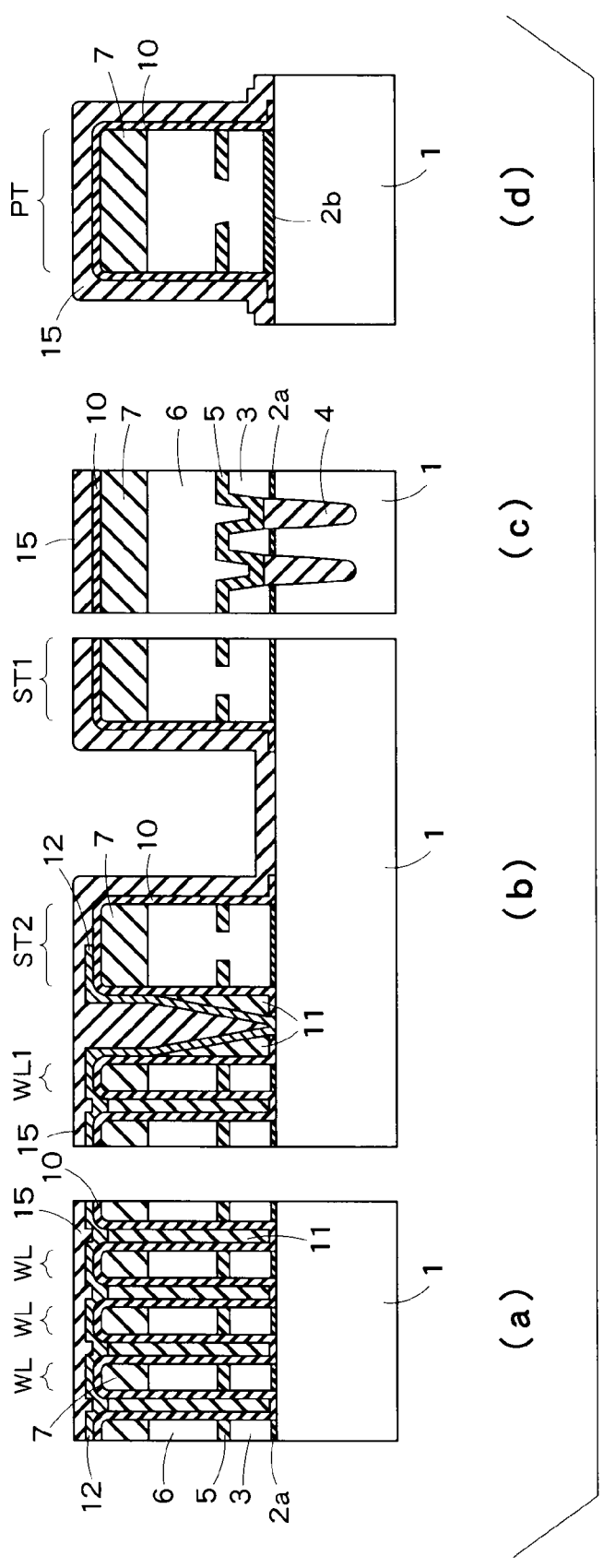
F I G. 8

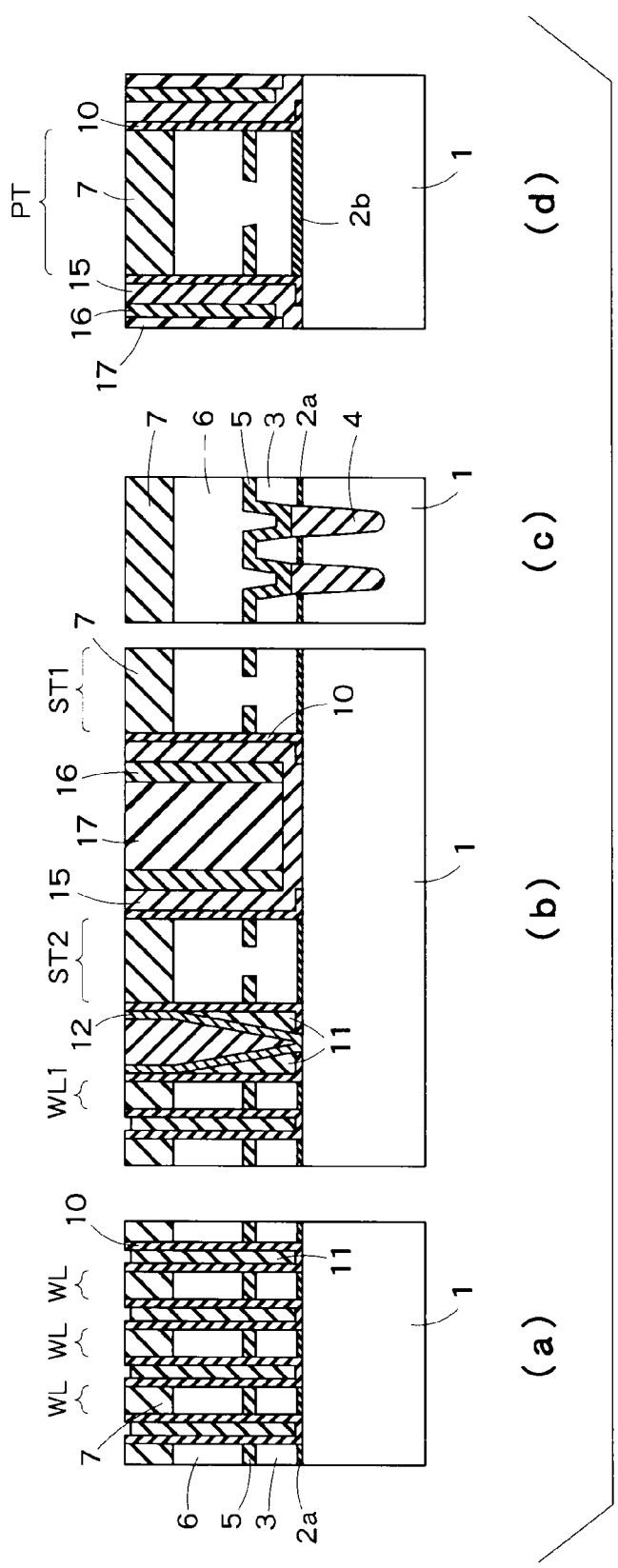
F I G. 10

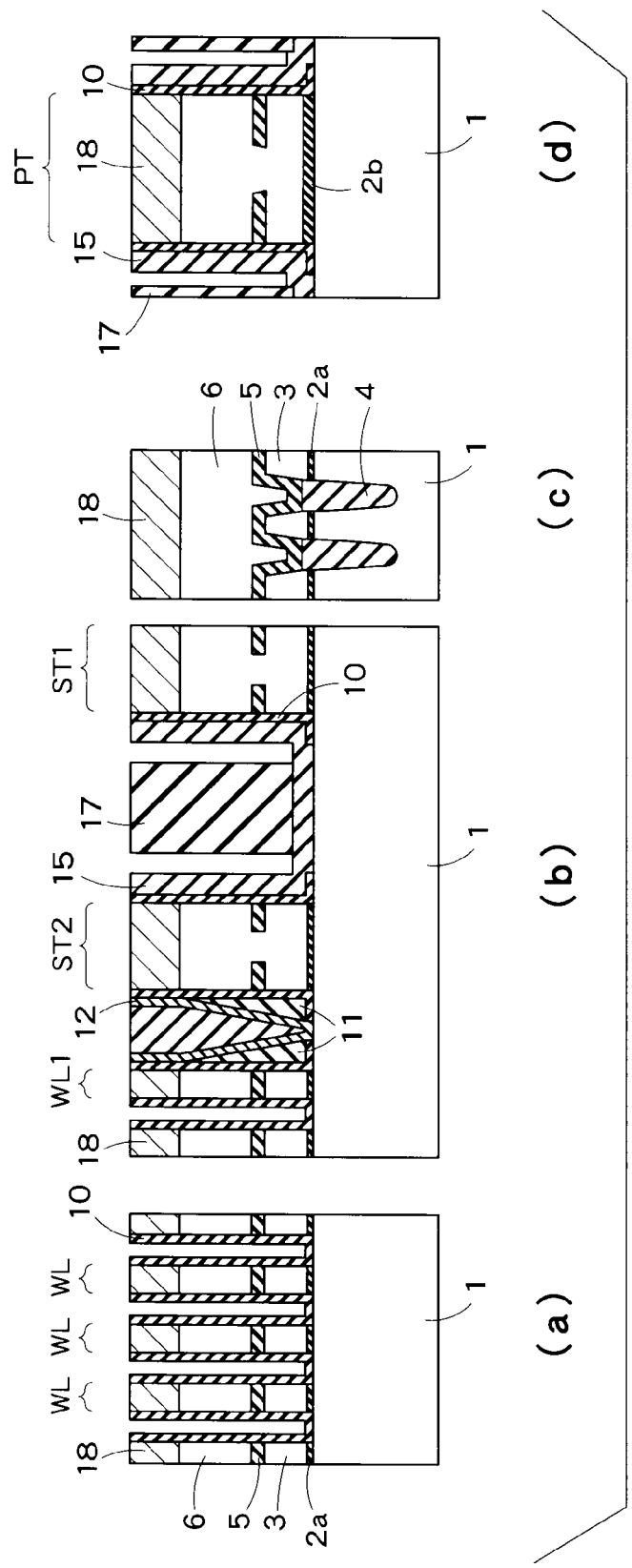
F I G. 13

SEMICONDUCTOR STORAGE DEVICE AND METHOD FOR MANUFACTURING THE SAME

CROSS-REFERENCE TO RELATED APPLICATION

This application is based upon and claims the benefit of priority from the prior Japanese Patent Application No. 2009-70602, filed on Mar. 23, 2009; the entire contents of which are incorporated herein by reference.

BACKGROUND OF THE INVENTION

1. Field of the Invention

The present invention relates to a semiconductor storage device and a method for manufacturing the semiconductor storage device, particularly to a NAND semiconductor storage device including a memory cell transistor, a selection gate transistor, and a high-voltage peripheral circuit transistor and a method for manufacturing the semiconductor device.

2. Related Art

In a conventional semiconductor storage device, a gap between word lines is filled with an oxide film or a nitride film. As a result, the gap between the word lines is shortened with shrink of devices, and as a result, there is a problem that a programming speed is lowered by a parasitic capacitance generated between floating gate electrodes of adjacent word lines or between the floating gate electrode and diffusion layers.

In order to solve the problem, there has been proposed a technique, in which an oxide film less buried is deposited on the word line and between the word lines, an air gap (cavity portion) is formed between the adjacent floating gate electrodes, thereby reducing the parasitic capacitance (for example, see U.S. Patent Application Publication Nos. 2006/0001073 and 2006/0231884).

In case that the air gap is formed using sacrifice nitride film containing a nitride film having fixed charges more than the oxide film, such the problem is occurred.

SUMMARY OF THE INVENTION

According to a first aspect of the present invention, there is provided a semiconductor storage device comprising:
a semiconductor substrate;
a first insulating film;
a laminated insulating film comprising a second insulating film having fixed charges more than those of the first insulating film;
a single-layer insulating film;
a plurality of memory cells between the semiconductor substrate and the first insulating film, each of the memory cells separated from an adjacent memory cell by a first cavity portion and comprising a tunnel insulating film, a charge accumulation layer, an insulating film, and a control gate electrode;
a first selection gate transistor between the semiconductor substrate and the first insulating film:
a second selection gate transistor between the semiconductor substrate and the first insulating film, between one of the memory cells and the first selection gate transistor, and in contact with the laminated insulating film on a first side face on a memory cell side thereof; and
a high-voltage peripheral circuit transistor between the semiconductor substrate and the first insulating film, and in contact with the single-layer insulating film on a side face thereof.

According to a second aspect of the present invention, there is provided a semiconductor storage device comprising:
a semiconductor substrate;
a first insulating film;
a plurality of memory cells between the semiconductor substrate and the first insulating film, each of the memory cells separated from an adjacent memory cell by a cavity portion and comprising a tunnel insulating film, a charge accumulation layer, an insulating film, a control gate electrode;
a first selection gate transistor between the semiconductor substrate and the first insulating film;
a second selection gate transistor between the semiconductor substrate and the first insulating film, and between one of the memory cells and the first selection gate transistor;
a spacer insulating film between the first selection gate transistor and the second selection gate transistor; and
a third insulating film on the spacer insulating film.

According to a third aspect of the present invention, there is provided a method for manufacturing a semiconductor device comprising:
forming gate electrodes of a plurality of memory cells comprising a tunnel insulating film, a charge accumulation layer, an insulating film, and a control gate electrode, a gate electrode of a first selection gate transistor, a gate electrode of a second selection gate transistor between one of the memory cells and the first selection gate transistor, and a gate electrode of a high-voltage peripheral circuit transistor;
forming an insulating film which covers the memory cells, the first selection gate transistor, the second selection gate transistor, and the high-voltage peripheral circuit transistor, and is buried between the memory cells;
processing the insulating film to remain on side faces of each of the memory cells, side faces of the first selection gate transistor, side faces of the second selection gate transistor, and side faces of the high-voltage peripheral circuit transistor;
selectively removing the insulating film remaining on the side faces of the first selection gate transistor and on the side faces of the high-voltage peripheral circuit transistor;
forming a spacer insulating film having fewer fixed charges than the insulating film on the side face of the second selection gate transistor and the side faces of the high-voltage peripheral circuit transistor;
removing the insulating film between the memory cells; and
depositing a first insulating film which covers upper portions of the memory cells, and thereby cavity portions between the memory cells are formed.

BRIEF DESCRIPTION OF THE DRAWINGS

FIG. 1 illustrates planar structures of a memory cell array area 100 and a peripheral circuit area 200 of the semiconductor storage device according to the embodiment.

FIGS. 2 to 13 are process sectional views illustrating the method for manufacturing the semiconductor storage device according to the embodiment.

DETAILED DESCRIPTION OF THE INVENTION

Hereafter, an embodiment of the present invention will be described more specifically with reference to the drawings.

Figure 14:
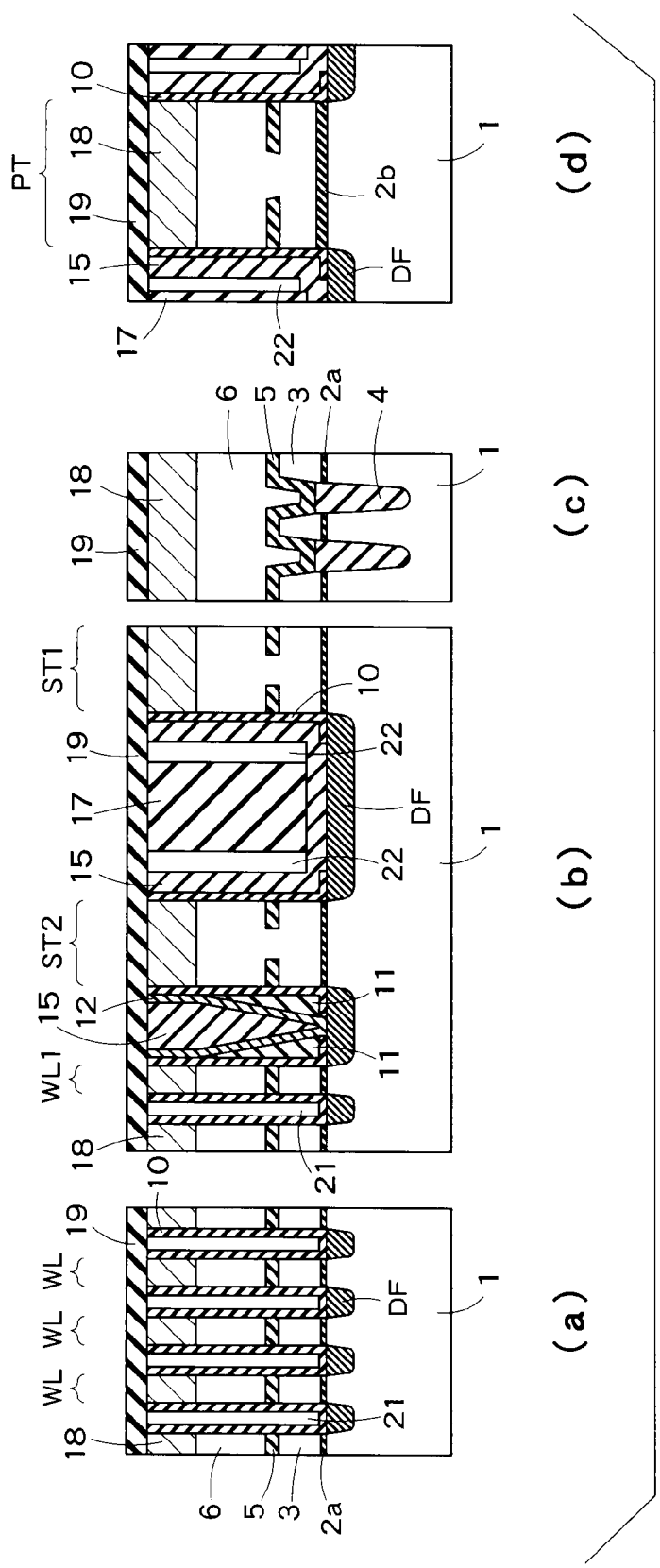
FIG. 14 illustrates sectional structures of the semiconductor storage device.

A structure of a semiconductor storage device according to an embodiment of the invention will be described. FIG. 1 illustrates planar structures of a memory cell array area 100 and a peripheral circuit area 200 in the semiconductor storage device according to the embodiment. FIG. 14 illustrates sectional structures of the semiconductor storage device. FIG. 14(*a*) is a longitudinal sectional view of a memory cell transistor taken on a line A-A of FIG. 1(*a*), FIG. 14(*b*) is a longitudinal sectional view of an end portion of the memory cell transistor and a selection gate transistor taken on a line B-B of FIG. 1(*a*), FIG. 14(*c*) is a longitudinal sectional view of the memory cell transistor taken on a line C-C of FIG. 1(*a*), and FIG. 14(*d*) is a longitudinal sectional view of a peripheral circuit transistor taken on a line D-D of FIG. 1(*a*).

As illustrated in FIG. 1(*a*), a surface area of the memory cell array area 100 includes plural active areas AA and plural shallow trench isolations STI. The active area AA and the shallow trench isolation STI extend in a Y-direction. One active area AA is sandwiched between two shallow trench isolations STI in an X-direction.

As illustrated in FIG. 1(*a*), plural word lines WL extend in the X-direction at constant intervals in the Y-direction and intersect with the active area AA. Each memory cell MC is provided at a point in which the word line WL and the active area AA intersect with each other. The area where the memory cells MC are disposed is referred to as memory cell area MCA.

A selection gate line SGL extending in the X-direction is disposed in an area (selection gate area SGA) sandwiched between the memory cell areas MCA. Each selection gate transistor ST is provided at a position in which the selection gate line SGL and the active area AA intersect with each other. A distance between the word line WL and the selection gate line SGL is longer than a distance between the word lines WL. The two selection gate lines SGL are disposed adjacently in the Y-direction. A distance between the selection gate lines SGL is longer than a distance between the word line WL and the selection gate line SGL. A contact Con is provided in the active area AA between the two selection gate lines SGL, and is shared by the two selection gate transistors ST.

As illustrated in FIG. 1(*b*), a high-voltage MIS transistor HVTr is provided in the peripheral circuit area 200. In the embodiment, hereinafter the area where the high-voltage MIS transistor HVTr is disposed (formed) in the peripheral circuit area 200 is referred to as high-voltage transistor forming area HVTA. The "high-voltage MIS transistor HVTr" is occasionally referred to as "high-voltage peripheral circuit transistor PT". The high-voltage transistor forming area HVTA has device areas DA which are surrounded by a shallow trench isolation (not illustrated) and electrically separated from each other. A gate electrode GE of each high-voltage MIS transistor HVTr extends in the X-direction so as to stride across the device area DA, and is extended onto the shallow trench isolation STI. The gate electrode GE is provided with a contact Con in the extended area A section of the semiconductor storage device according to the embodiment will be described below. As illustrated in FIG. 14, the section of the semiconductor storage device according to the embodiment includes a semiconductor substrate 1 and a memory cell transistor. The memory cell transistor includes plural memory cells (word line WL). Each of the memory cells includes a tunnel insulating film 2*a*, a charge accumulation layer 3 (floating gate electrode), an inter-poly insulating film 5, and control gate electrode 6, which are laminated in sequence on the semiconductor substrate 1.

The semiconductor storage device according to the embodiment includes a pair of selection gate transistors between the memory cells (word lines WL) and the high-voltage peripheral circuit transistor PT. The pair of selection gate transistors includes a first selection gate transistor ST1 and a second gate transistor ST2. The second selection gate transistor ST2 is between a memory cell (word line WL1) at the end of the memory cell transistors and a first selection gate transistor ST1. Each of the first selection gate transistor ST1 and the selection gate transistor ST2 includes the gate electrode on the tunnel insulating film 2*a*. The structure of the gate electrode of each of the first selection gate transistor ST1 and the second selection gate transistor ST2 is identical to that of each of the memory cells except that the inter-poly insulating film 5 has an opening through which the charge accumulation layer 3 and the control gate electrode 6 are connected.

The semiconductor storage device according to the embodiment includes the high-voltage peripheral circuit transistor PT formed in a peripheral circuit area. The peripheral circuit transistor PT includes the gate electrode on the gate insulating film 2*b*. The gate insulating film 2*b* may be made of the same material as that of the tunnel insulating film 2*a*, or may be made of a material different from that of the tunnel insulating film 2*a*. The gate insulating film 2*b* may have a film thickness different from that of the tunnel insulating film 2*a*. The structure of the gate electrode is identical to that of each of the first selection gate transistor ST1 and the second selection gate transistor ST2. That is, in the gate electrode of the peripheral circuit transistor PT, the inter-poly insulating film 5 has the opening through which the charge accumulation layer 3 and the control gate electrode 6 are connected.

The memory cell transistor is in contact with a first insulating film (barrier insulating film, for example, silicon oxide film) 19 formed thereon. The memory cell transistor includes a first cavity portion (air gap) 21 formed in an area between the first insulating film 19 and the memory cell (word line WL).

A protective insulating film 10 is formed on a side face (first side face) on the memory cell side of the second selection gate transistor ST2. A second insulating film (sacrifice nitride film, for example, silicon nitride film) 11 is formed on a side face of the protective insulating film 10 which has more fixed charges than the first insulating film 19. An upper surface of the second insulating film 11 is formed lower than that of each of the first selection gate transistor ST1 and the second selection gate transistor ST2. A cover insulating film (for example, silicon oxide film) 12 is formed so as to cover the second insulating film 11. The protective insulating film 10, the second insulating film 11, and the cover insulating film 12 correspond to a laminated insulating film. That is, the second selection gate transistor ST2 is in contact with the first insulating film 19 formed thereon, and is in contact with the laminated insulating film including the second insulating film 11 having more fixed charges than the first insulating film 19 on the side face on the memory cell transistor side.

Similarly, a laminated insulating film having the same structure as the laminated insulating film formed in the second selection gate transistor ST2 is formed on a side face on the side of the second selection gate transistor ST2 of the memory cell transistor side. A spacer insulating film 15 is buried between the memory cell and the laminated insulating film of the second selection gate transistor ST2. The first insulating film 19 is formed on the spacer insulating film 15, and is continuously formed from the memory cell to the spacer insulating film 15. In case that the cover insulating film 12 and the spacer insulating film 15 are made of the same material, a boundary between layers of the laminated insulating film becomes unclear. In this case, the boundary is roughly estimated from a boundary between the second insulating film 11 and the cover insulating film 12. The spacer insulating film 15 has fewer fixed charges than the second insulating film 11.

The protective insulating film 10 is formed between the first selection gate transistor ST1 and the second selection gate transistor ST2, and on the side face of the peripheral circuit transistor PT. The spacer insulating film 15 is formed on the side face of the protective insulating film 10, and is continuously formed from the semiconductor substrate 1. The protective insulating film 10 and the spacer insulating film 15 are made of the same material to constitute a single-layer insulating film. Occasionally, the protective insulating film 10 is not formed. In such cases, a single-layer insulating film includes only the spacer insulating film 15. An inter-layer insulating film 17 (third insulating film) is formed on the spacer insulating film 15. That is, the second selection gate transistor ST2 is in contact with the single-layer insulating film on the side face (second side face) opposite to the memory cell transistor, and the single-layer insulating film includes the protective insulating film 10 and the spacer insulating film 15. On the other word, the single-layer insulating film is provided between the first selection gate transistor ST1 and the second selection gate transistor ST2. The peripheral circuit transistor PT is in contact with the first insulating film 19 formed thereon. The peripheral circuit transistor PT is also in contact with the single-layer insulating film on the side face thereof, and the single-layer insulating film includes the protective insulating film 10 and the spacer insulating film 15.

The inter-layer insulating film 17 is formed between the first selection gate transistor ST1 and the second selection gate transistor ST2, and between the peripheral circuit transistors PT. The inter-layer insulating film 17 is formed such that a second cavity portion (air gap) 22 is interposed between the inter-layer insulating film 17 and the side face of the spacer insulating film 15.

A method for manufacturing the semiconductor storage device according to the embodiment will be described with reference to the drawings. FIGS. 2 to 13 are process sectional views illustrating the method for manufacturing the semiconductor storage device according to the embodiment. FIGS. 2(a), 3(a), 4(a), 5(a), 6(a), 7(a), 8(a), 9(a), 10(a), 11(a), 12(a), and 13(a) are longitudinal sectional views of the memory cell transistor taken on the line A-A of FIG. 1(a), respectively. FIGS. 2(b), 3(b), 4(b), 5(b), 6(b), 7(b), 8(b), 9(b), 10(b), 11(b), 12(b), and 13(b) are longitudinal sectional views of the end portion of the memory cell transistor and the selection gate transistor taken on the line B-B of FIG. 1(a), respectively. FIGS. 2(c), 3(c), 4(c), 5(c), 6(c), 7(c), 8(c), 9(c), 10(c), 11(c), 12(c), and 13(c) are longitudinal sectional views of the memory cell transistor taken on the line C-C of FIG. 1(a), respectively. FIGS. 2(d), 3(d), 4(d), 5(d), 6(d), 7(d), 8(d), 9(d), 10(d), 11(d), 12(d), and 13(d) are longitudinal sectional views of the peripheral circuit transistor taken on the line D-D of FIG. 1(a), respectively.

Processes to word line processing will be described with reference to FIG. 2.

Figure 2:
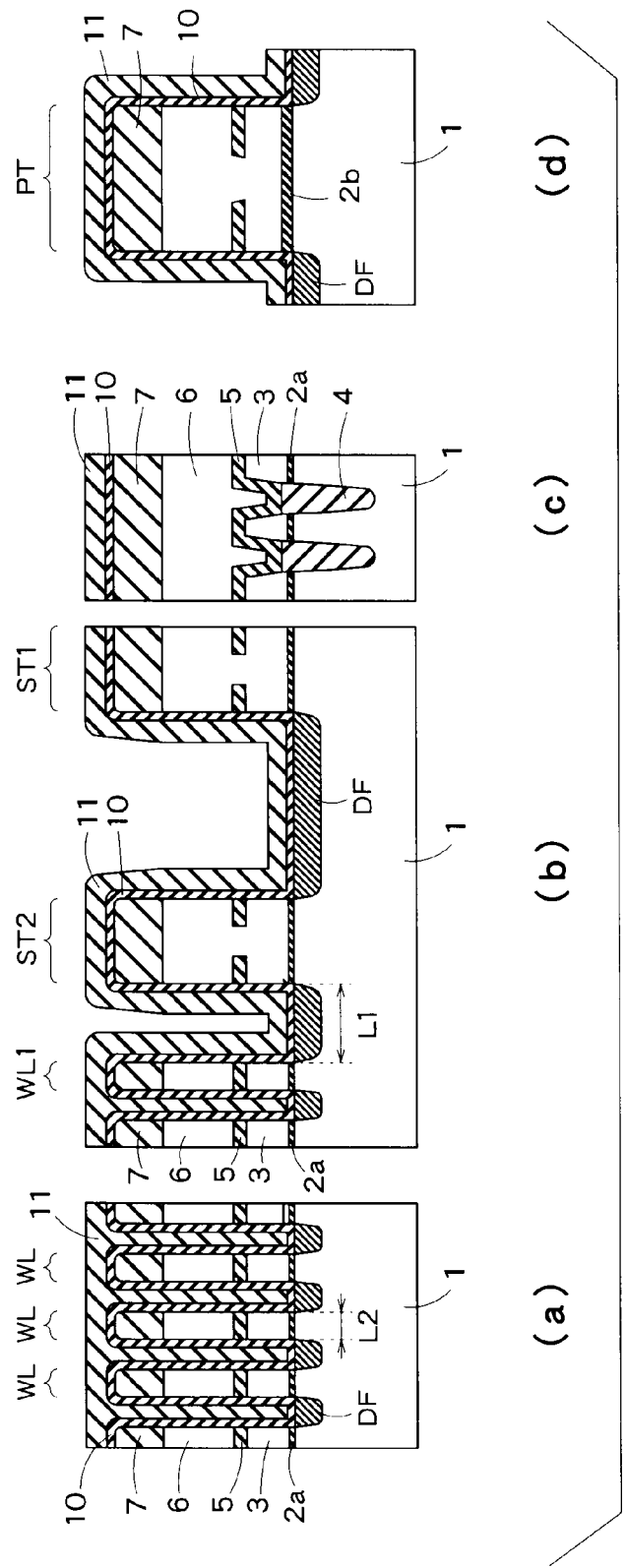

As illustrated in FIG. 2, the tunnel insulating film 2a including a silicon oxide film is formed on the semiconductor substrate 1. The charge accumulation layer 3 (first polysilicon film) including a polysilicon film is formed on the tunnel insulating film 2a. At this step, the tunnel insulating film 2a of the peripheral circuit transistor PT is formed thicker than the tunnel insulating films 2a of the other areas. As a result, peripheral circuit transistor PT becomes the high-voltage transistor.

The charge accumulation layer 3, the tunnel insulating film 2a, and the semiconductor substrate 1 are removed to form grooves at predetermined intervals along a first direction (Y-direction of FIG. 1). The silicon oxide film fills in the groove to a predetermined height to form a Shallow Trench Isolation (STI) 4.

The inter-poly insulating film 5 is formed so as to cover the charge accumulation layer 3 and the shallow trench isolation 4. A first polysilicon film is formed on the inter-poly insulating film 5. A groove is formed by partially removing the first polysilicon film and the inter-poly insulating film 5 in predetermined positions of the area (selection gate forming area SGA) where the first selection gate transistor ST1 and the second selection gate transistor ST2 are formed and the area (high-voltage transistor forming area HVTA) where the peripheral circuit transistor PT is formed. A second polysilicon film is formed on the first polysilicon film so as to fill in the groove.

As a result, in the memory cell transistor, the control gate electrode 6 is formed to include the second polysilicon film. The first selection gate transistor ST1, the second selection gate transistor ST2, and the peripheral circuit transistor PT have an etching inter-poly structure in which the polysilicon films (electrode layer) are connected above and below the inter-poly insulating film 5.

A silicon nitride film 7 is formed on the control gate electrode 6. The word line (the gate electrode of the memory cell transistor), the gate electrodes of the first selection gate transistor ST1, the second selection gate transistor ST2, and the peripheral circuit transistor PT can be processed by removing the silicon nitride film 7, the control gate electrode 6, the inter-poly insulating film 5, the floating gate electrode 4, and the tunnel insulating film 2a at predetermined intervals along the second direction (X-direction of FIG. 1) orthogonal to the first direction. The tunnel insulating film 2a may be remained without removing it.

A width L1 between the second selection gate transistor ST2 and the word line WL1 adjacent to the second selection gate transistor ST2 is set so as to become at least three times a width L2 of a bottom of the word line. The first selection gate transistor ST1 and the second selection gate transistor are disposed at both ends of the plural word lines WL, respectively.

After processing the word line, the protective insulating film (silicon oxide film) 10 is formed so as to cover the word line WL, the gate electrodes of the first selection gate transistor ST1, the second selection gate transistor ST2, and the peripheral circuit transistor PT. At this step, the protective insulating film 10 is formed so as to have a film thickness that does not fill in the gap between the word lines WL, the gap between the word line WL and the electrode of the second selection gate transistor ST2, the gap between the electrodes of the first selection gate transistor ST1 and the second selection gate transistor ST2, and the gap between the peripheral circuit transistors PT. Then impurities are implanted by using the word line WL, the electrodes of the first selection gate transistor ST1 and the second selection gate transistor ST2, and the electrode of the peripheral circuit transistor PT as a mask to form diffusion layers DF in a surface portion of the semiconductor substrate 1. The diffusion layers DF are omitted in FIGS. 4 to 13 for convenience.

The electrodes of the first selection gate transistor ST1, the second selection gate transistor, and the peripheral circuit transistor PT are covered with the protective insulating film 10, and the second insulating film 11 is formed so as to fill in the space between the word lines WL (memory cell). At this step, the second insulating film 11 does not fill in the space between the word lines WL, the space between the word line WL and the electrode of the second selection gate transistor ST2, and the space between the protective insulating film 10 and the electrode of the peripheral circuit transistor PT. For example, preferably the second insulating film 11 is formed by an ALD (Atomic Layer Deposition) method. The second insulating film 11 may be formed by an LP-CVD (Low Pressure-Chemical Vapor Deposition) method or a plasma CVD method.

Figure 3:
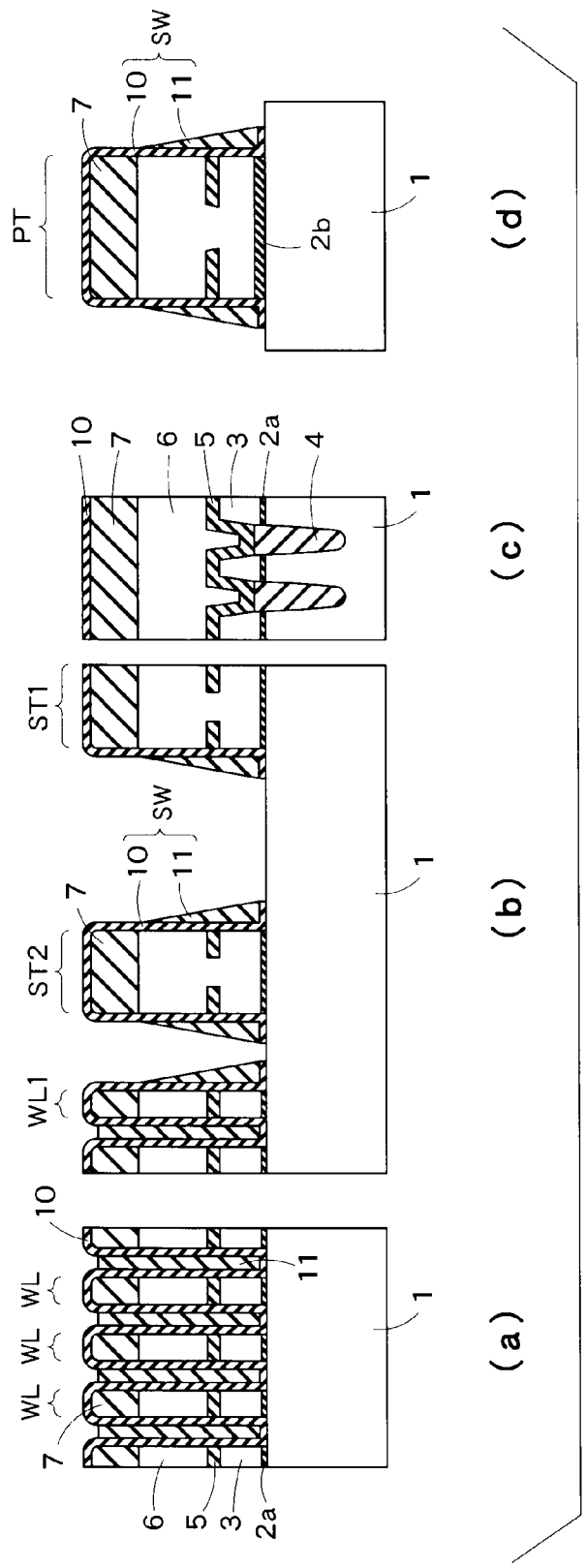

As illustrated in FIG. 3, the second insulating film 11 is etched back by RIE (Reactive Ion Etching) to form sidewalls (sidewall films) SW on the side face of the first selection gate transistor ST1, the side face of the second selection gate transistor ST2, the side face of the peripheral circuit transistor PT, and the side face of the word line WL1. The side face of the word line WL1 faces the side face of the second selection gate transistor ST2. The sidewall SW includes the second insulating film 11 and the protective insulating film 10.

An RIE etching condition at this step is selected so that the upper portions of the second insulating films 11 on the side faces of the first selection gate transistor ST1, the second selection gate transistor ST2, and the peripheral circuit transistor PT are etched back more than the lower portions of the second insulating films 11 on the side faces of the first selection gate transistor ST1, the second selection gate transistor ST2, and the peripheral circuit transistor PT. That is, the sidewalls SW are processed so that they remain on the side faces of the memory transistor, the first selection gate transistor ST1, the second selection gate transistor ST2, and peripheral circuit transistor PT. As a result, the upper portions of the sidewalls SW are etched, and the upper surfaces of the sidewalls SW become lower than that of the silicon nitride films 7. Occasionally, the second insulating films 11 on the side faces of the second selection gate transistor ST2 and peripheral circuit transistor PT have triangular shapes. The second insulating film 11 filling in the space between the word lines WL is simultaneously etched. However, only the upper portion of the second insulating film 11 is partially etched, and the second insulating film 11 remains between the word lines WL.

Figure 4:
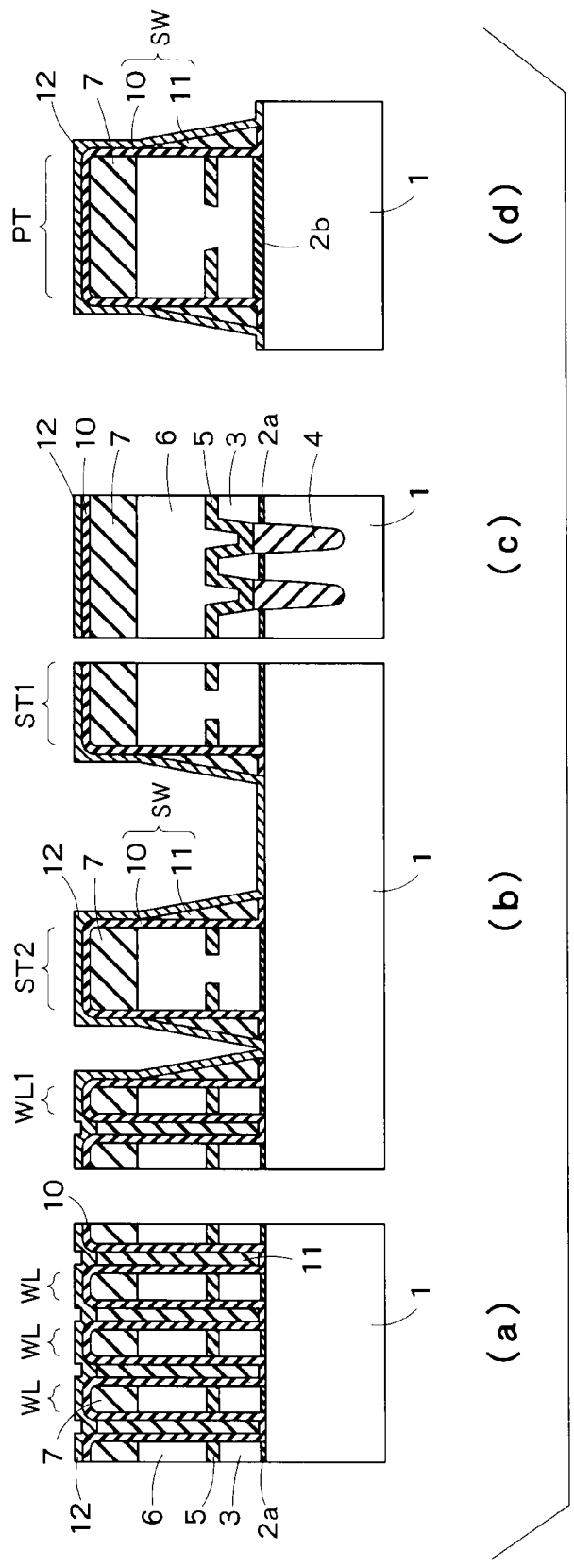

As illustrated in FIG. 4, the cover insulating film (for example, silicon oxide film) 12 is formed on the whole surface of the semiconductor substrate 1. At this step, the cover insulating film 12 is formed so as to have a film thickness that does not fill in the space between the word line WL and the electrode of the second selection gate transistor ST2 and the space between the electrodes of the peripheral circuit transistors PT.

As illustrated in FIG. 5, a resist 14 is formed through lithography processing such that the word line WL is covered with the resist 14 from the neighborhood of the center of the second selection gate transistor ST2. That is, the resist 14 is formed such that an opening between the selection gate transistor ST1 and the second selection gate transistor ST2 is formed. The resist 14 is also formed such that an opening between the peripheral circuit transistors PT is formed.

Figure 6:
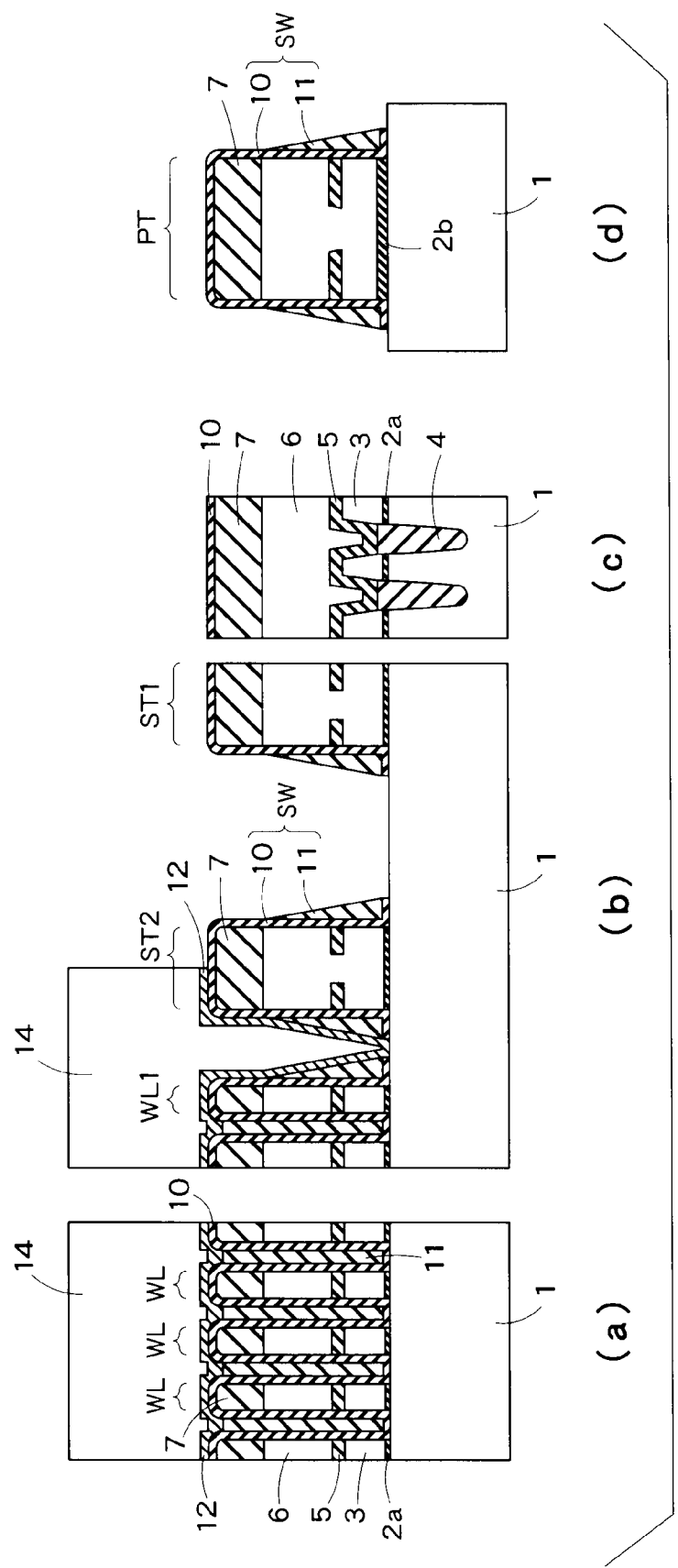

As illustrated in FIG. 6, the cover insulating film 12 exposed from the opening of the resist 14 is removed. That is, the cover insulating films 12 remaining on the side face of the first selection gate transistor ST1 not adjacent to the memory cell transistor and the side face of the peripheral circuit transistor PT are selectively removed. As a result, the surface between the selection gate transistors and the surface of the sidewall SW of the peripheral circuit transistor PT are exposed. For example, the cover insulating film 12 is removed by RIE. In case that the cover insulating film 12 and the protective insulating film 10 are made of the same material, possibly the protective insulating film 10 is partially etched. However, even if the protective insulating film 10 is partially etched, there is no problem as long as the silicon nitride film 7 is not exposed.

As illustrated in FIG. 7, the resist 14 is removed through a combination of ashing, SPM (Sulfuric-Peroxide Mixture) cleaning, and APM (Ammonium-Peroxide Mixture) cleaning. Then the second insulating films 11 formed on the side face of the second selection gate transistor ST2 on the side opposite to the word line WL1 and the side face of the peripheral circuit transistor PT are removed by using the protective insulating film 10 as a protective film by wet etching with hot phosphoric acid. The sidewall SW formed on the side face of the word line WL1, which faces the side face of the second selection gate transistor ST2, the sidewall SW formed on the side face of the second selection gate transistor ST2, which faces the word line WL1, and the second insulating film 11 formed between the word lines WL are covered with the cover insulating film 12. Therefore, the sidewalls SW and the second insulating film 11 are not removed.

At this step, it is considered that the sidewall SW is selectively removed using the resist 14. However, the resist 14 is dissolved by the wet etching with hot phosphoric acid. Therefore, the resist 14 cannot be used as the mask. The sidewall SW is selectively removed using the cover insulating film 12. Preferably, the silicon oxide film is used as the protective insulating film 10, because an etching selectivity of the protective insulating film 10 is enhanced relative to the second insulating film 11 in the wet etching with hot phosphoric acid. Therefore, the sidewalls SW are formed on the side face of the word line WL1, which faces the side face of the second selection gate transistor ST2, and on the side face of the second selection gate transistor ST2, which faces the word line WL1, and the cover insulating film 12 is formed so as to cover the second insulating film 11 between the word lines WL.

As illustrated in FIG. 8, the silicon oxide film is deposited on the whole surface of the semiconductor substrate 1 by, for example, the LP-CVD method to form the spacer insulating film 15. In the process, the space between the word line WL and the second selection gate transistor ST2 is filled with the spacer insulating film 15. At the same time, the spacer insulating film 15 is formed on the side face of the peripheral circuit transistor PT. When the cover insulating film 12 and the spacer insulating film 15 are made of the same material, the cover insulating film 12 and the spacer insulating film 15 form the single-layer insulating film.

Figure 9:
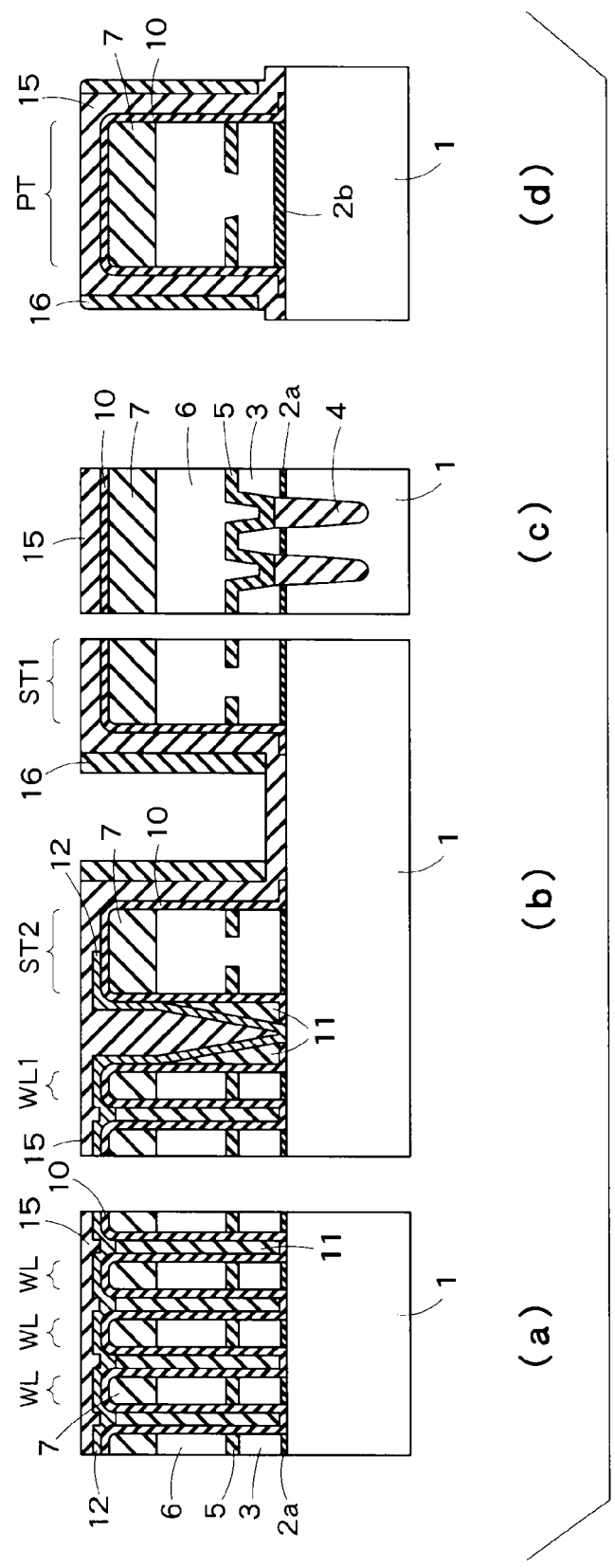

As illustrated in FIG. 9, the liner insulating film 16 including the silicon nitride film is formed on the whole surface of the semiconductor substrate 1 by, for example, the LP-CVD method. At this step, the liner insulating film 16 is formed along the upper surface of the spacer insulating film 15. Then the liner insulating films 16 except for the liner insulating film 16 between the selection gate transistor ST1 and the second selection gate transistor ST2, and on the side face of the peripheral circuit transistor PT are removed by anisotropic etching such as RIE.

As illustrated in FIG. 10, the inter-layer insulating film 17 is formed by filling the space between the first selection gate transistor ST1 and the second selection gate transistor ST2, and the space between the peripheral circuit transistors PT with the silicon oxide film or BPSG (Boron Phosphorous Silicate Glass). Then the inter-layer insulating film 17 is flattened by CMP (Chemical Mechanical Polishing) using the silicon nitride film 7 as a stopper. At this step, the upper surface of the second insulating film 11 between the word lines WL is exposed. On the other hand, the upper surface of the sidewall SW between the word line WL1 and the second selection gate transistor ST2 is located lower than the upper surface of the silicon nitride film 7 and is covered with the spacer insulating film 15. Therefore, the upper surface of the sidewall SW between the word line WL1 and the second selection gate transistor ST2 is not exposed.

Figure 11:
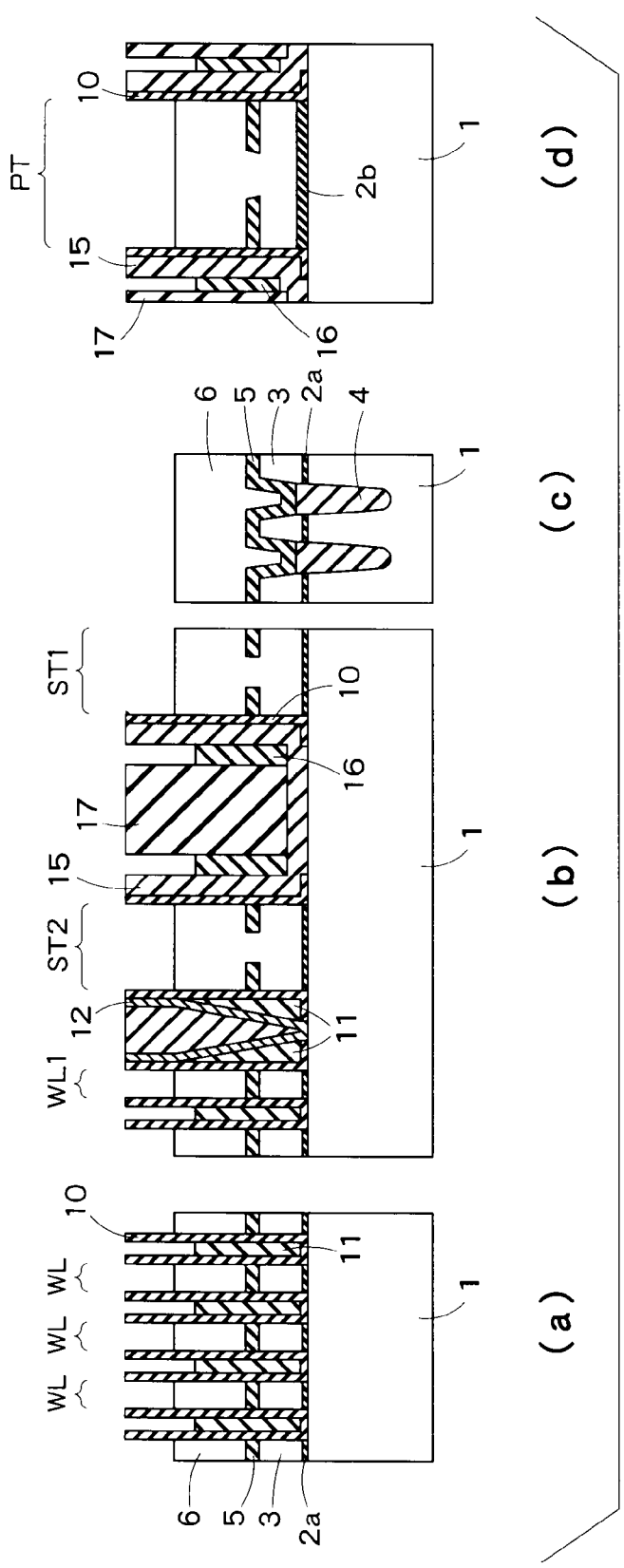

As illustrated in FIG. 11, the silicon nitride film 7 is removed by, for example, RIE to expose the upper surface of the control gate electrode 6. The second insulating film 11, the cover insulating film 12, the liner insulating film 16, and the inter-layer insulating film 17 are slightly removed upon removing the silicon nitride film 7.

Figure 12:
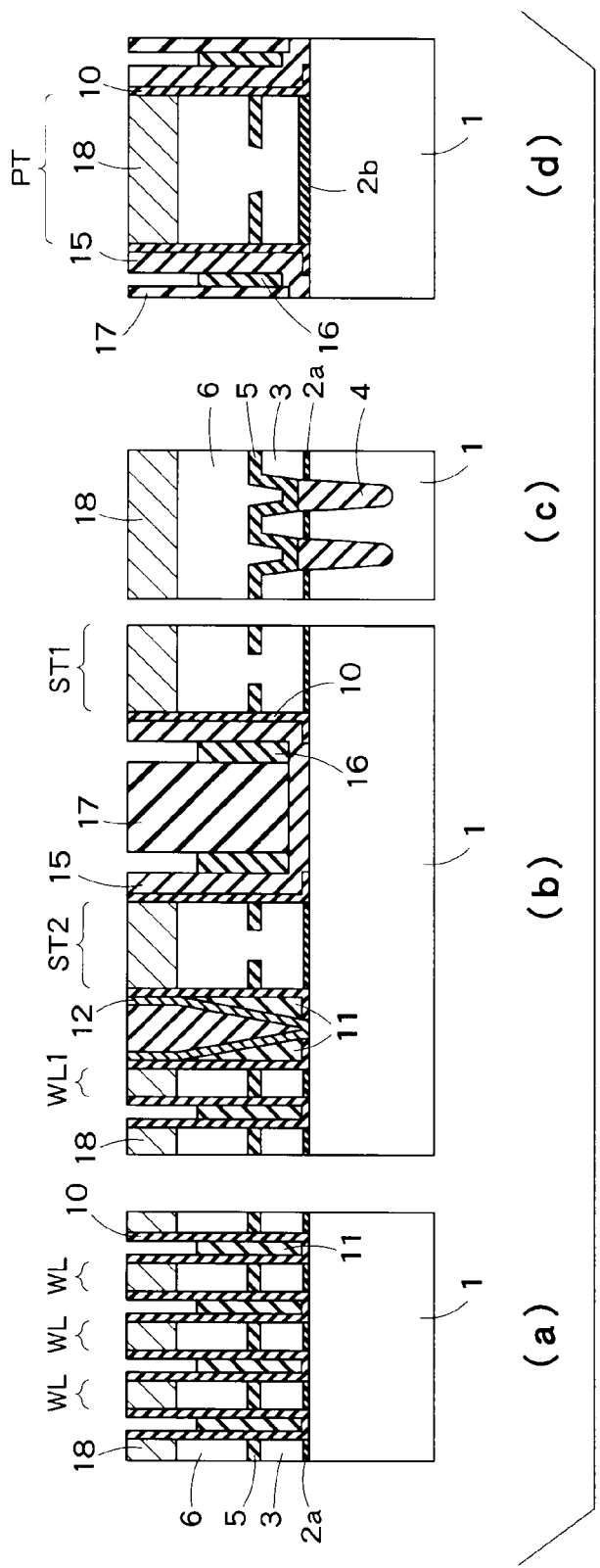

As illustrated in FIG. 12, silicide is formed in part or the whole of the control gate electrode 6 to form a silicide layer 18. IV-group to XI-group transition metals such as Ni, Ti, Co, Pt, Pd, Ta, and Mo can be used in a metallic material for the silicide layer 18.

As illustrated in FIG. 13, the second insulating film 11 between the word lines WL is removed by wet etching or CDE (Chemical Dry Etching). As a result, a gap is formed between the word lines WL. At this step, the liner insulating film 16 between the first selection gate transistor ST1 and the second selection gate transistor ST2, and the liner insulating film 16 of the peripheral circuit transistors PT are also removed, thereby forming a space between the spacer insulating film 15 and the inter-layer insulating film 17.

As illustrated in FIG. 14, the first insulating film 19 is formed on the whole surface of the semiconductor substrate 1 by the plasma CVD method. Ordinarily, an embeddability in the plasma CVD method is low. Therefore, the space between the word lines WL, the space between the first selection gate transistor ST1 and the second selection gate transistor ST2, and the space on the side face of the peripheral circuit transistor PT are not filled with the first insulating film 19. As a result, these spaces become the first cavity portion 21 and the second cavity portion 22. Then the inter-layer insulating film 19 is formed on the liner insulating film 16.

According to the embodiment, the second insulating film 11 forming the sidewall SW of the peripheral circuit transistor PT is removed. Thereby, the transistor characteristic due to the second insulating film 11 can be prevented from being deteriorated.

According to the embodiment, the second insulating film 11 forming the sidewall SW between the first selection gate transistor ST1 and the second selection gate transistor ST2 is removed, thereby shrinking, the semiconductor storage device.

According to the embodiment, the first cavity portion 21 is formed between the word lines WL. The second cavity portion 22 is formed on the side face between the first selection gate transistor ST1 and the second selection gate transistor ST2, and on the side face of the peripheral circuit transistor PT. Thereby, a parasitic capacitance or a parasitic fringe capacitance between charge accumulation layers 3 can be reduced, and the operation speed of the memory cell MC can be enhanced.

According to the embodiment, the second insulating film (sacrifice nitride film) 11 having the electric breakdown voltage higher than that of the silicon oxide film is formed between the second selection gate transistor ST2 and the word line WL1. Thereby, the breakdown voltage can be improved between the second selection gate transistor ST2 and the word line WL1.

According to the embodiment, while the second insulating film 11 and the cover insulating film 12 are formed between the second selection gate transistor ST2 and the adjacent word line WL1, the second insulating film 11 and the cover insulating film 12 are not formed between the first selection gate transistor ST1 and the second selection gate transistor ST2. Therefore, the space between the first selection gate transistor ST1 and the second selection gate transistor ST2 is wider by the second insulating film 11 and the cover insulating film 12 than that of the conventional structure. Thereby, the space between the first and second selection gate transistors ST1, ST2 and the contact can be increased to improve a processing margin. Further, because the process margin is improved, the space between the first selection gate transistor ST1 and the second selection gate transistor ST2 can be shorter than that of the conventional structure. Thereby, the circuit area can be shrunk.

According to the embodiment, the space between the second selection gate transistor ST2 and the adjacent word line WL1 increases. Thereby, a GIDL (Gate Induced Drain Leakage) current can be reduced to prevent cut-off abnormality.

The second cavity portion 22 is formed on the side face of the peripheral circuit transistor PT. Therefore, the breakdown voltage can be improved between the gate electrode and the drain electrode. This is particularly effective in case that the peripheral circuit transistor PT is the high-voltage MIS transistor HVTr. Occasionally, a potential difference of 20 V or more is applied between the drain electrode and the gate electrode of the high-voltage MIS transistor HVTr. The electric field from the side face of the gate electrode to the drain electrode is relaxed by the second cavity portion 22 on the side face of the high-voltage MIS transistor HVTr. Thereby, the breakdown voltage can be improved between the gate electrode and the drain electrode.

In the embodiment, as illustrated in FIGS. 12 and 13, the second insulating film 11 is removed after the silicide of the control gate electrode 6 is formed. However, the scope of the invention is not limited to the embodiment. Alternatively, the silicide of the control gate electrode 6 may be formed after the second insulating film 11 is removed.

In the embodiment, the semiconductor storage device having the floating gate structure in which the charges are accumulated in the charge accumulation layer 3 has been described by way of example in the embodiment. However, the scope of the invention is not limited to the semiconductor storage device according to the embodiment. The invention can also be applied to a nitride film-trap MONOS (Metal-Oxide-Nitride-Oxide-Silicon) structure and a SONOS (Silicon-Oxide-Nitride-Oxide-Silicon) structure.

The embodiment is described only by way of example, and the scope of the invention is not limited to the embodiment. The technical scope of the invention is described only in claims, and it is noted that meanings equivalent to claims and all the modifications in claims are included in the scope of the invention.

What is claimed is:

1. A semiconductor storage device comprising:
   a semiconductor substrate;
   a first insulating film;
   a laminated insulating film comprising a second insulating film having fixed charges more than those of the first insulating film;
   a single-layer insulating film;
   a plurality of memory cells between the semiconductor substrate and the first insulating film, each of the memory cells separated from an adjacent memory cell by a first cavity portion and comprising a tunnel insulating film, a charge accumulation layer, an insulating film, and a control gate electrode;
   a first selection gate transistor between the semiconductor substrate and the first insulating film;

a second selection gate transistor between the semiconductor substrate and the first insulating film, between one of the memory cells and the first selection gate transistor, and in contact with the laminated insulating film on a first side face on a memory cell side thereof; and a high-voltage peripheral circuit transistor between the semiconductor substrate and the first insulating film, and in contact with the single-layer insulating film on a side face thereof.

2. The device of claim 1, wherein the second selection gate transistor is in contact with the single-layer insulating film on a second side face opposite to the first side face thereof.

3. The device of claim 1, wherein
the first insulating film is a silicon oxide; and
the second insulating film is a silicon nitride.

4. The device of claim 1, wherein an upper surface of the second insulating film is lower than upper surfaces of the first selection gate transistor and of the second selection gate transistor.

5. The device of claim 1, wherein each of the memory cells further comprises a protective insulating film between each of the memory cells and the first cavity portion.

6. The device of claim 1, further comprising a third insulating film between the first selection gate transistor and the second selection gate transistor, and between a plurality of the high-voltage peripheral circuit transistors.

7. The device of claim 6, further comprising a second cavity portion in an area surrounded by the first insulating film, the single-layer insulating film, and the third insulating film.

8. The device of claim 7, wherein
the single-layer insulating film is between the first selection gate transistor and the second selection gate transistor.

9. A semiconductor storage device comprising:
a semiconductor substrate;
a first insulating film;

a plurality of memory cells between the semiconductor substrate and the first insulating film, each of the memory cells separated from an adjacent memory cell by a cavity portion and comprising a tunnel insulating film, a charge accumulation layer, an insulating film, a control gate electrode;

a first selection gate transistor between the semiconductor substrate and the first insulating film;

a second selection gate transistor between the semiconductor substrate and the first insulating film, and between one of the memory cells and the first selection gate transistor;

a spacer insulating film between the first selection gate transistor and the second selection gate transistor; and a third insulating film on the spacer insulating film.

10. The device of claim 9, further comprising a high-voltage peripheral circuit transistor between the semiconductor substrate and the first insulating film, wherein
the third insulating film is on the side face of the high-voltage peripheral circuit transistor.

11. The device of claim 10, further comprising a second insulating film between the second selection gate transistor and one of the memory cells, wherein
the spacer insulating film is between the second insulating film on a side wall of the second selection gate transistor and on a side wall of one of the memory cells.

12. The device of claim 11, further comprising a cover insulating film between the second insulating film and the spacer insulating film.

13. The device of claim 12, wherein an upper surface of the second insulating film is lower than upper surfaces of the first selection gate transistor and of the second selection gate transistor.

14. The device of claim 11, wherein the second insulating film has a triangular shape.

* * * * *